(12) United States Patent
Shih et al.

(10) Patent No.: US 9,123,754 B2
(45) Date of Patent: Sep. 1, 2015

(54) BONDING ALIGNMENT TOOL AND METHOD

(75) Inventors: Yun-Tai Shih, Lugang Township (TW); Kuan-Ming Pan, Hsinchu (TW); Jeng-Hao Lin, Chubei (TW); I-Shi Wang, Sanxia Township (TW); Jui-Mu Cho, Chupei (TW); Ching-Hou Su, Hsinchu (TW); Chyi-Tsong Ni, Hsinchu (TW); Wun-Kai Tsai, Huwei Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 882 days.

(21) Appl. No.: 13/267,336

(22) Filed: Oct. 6, 2011

(65) Prior Publication Data

US 2013/0086786 A1  Apr. 11, 2013

(51) Int. Cl.
| | |
|---|---|
| *B23Q 17/00* | (2006.01) |
| *H01L 21/67* | (2006.01) |
| *H01L 21/68* | (2006.01) |

(52) U.S. Cl.
CPC ........ *H01L 21/67092* (2013.01); *H01L 21/681* (2013.01); *H01L 21/68* (2013.01); *H01L 21/682* (2013.01); *Y10T 29/49* (2015.01); *Y10T 29/49002* (2015.01); *Y10T 29/49131* (2015.01); *Y10T 29/49764* (2015.01); *Y10T 29/53022* (2015.01)

(58) Field of Classification Search
CPC ..... H01L 21/68; H01L 21/681; H01L 21/682; H01L 21/67092; Y10T 29/53022; Y10T 29/49764; Y10T 29/49; Y10T 29/49002; Y10T 29/49131

USPC ......... 29/407.01, 592, 407.09, 705, 700, 712, 29/833, 834, 835, 836, 759; 156/306.3, 156/580, 64, 273.7, 285, 264; 438/457, 438/455, 401; 228/44.7, 44.3
See application file for complete search history.

(56) References Cited

U.S. PATENT DOCUMENTS

| | | | | |
|---|---|---|---|---|
| 5,855,637 | A * | 1/1999 | Yakou et al. | 65/29.12 |
| 6,008,113 | A * | 12/1999 | Ismail et al. | 438/615 |
| 7,682,933 | B1 * | 3/2010 | Loomis | 438/457 |
| 8,147,630 | B2 * | 4/2012 | George | 156/64 |
| 2003/0092244 | A1 * | 5/2003 | Oi et al. | 438/455 |
| 2005/0181579 | A1 * | 8/2005 | Thallner | 438/455 |
| 2007/0249098 | A1 * | 10/2007 | Cady et al. | 438/119 |
| 2008/0164606 | A1 * | 7/2008 | Greisen et al. | 257/726 |
| 2009/0251699 | A1 * | 10/2009 | George | 356/401 |
| 2010/0047052 | A1 * | 2/2010 | Burke et al. | 414/754 |
| 2010/0071847 | A1 * | 3/2010 | Shin et al. | 156/285 |

(Continued)

*Primary Examiner* — Peter DungBa Vo
*Assistant Examiner* — Azm Parvez
(74) *Attorney, Agent, or Firm* — Lowe Hauptman & Ham, LLP

(57) ABSTRACT

An apparatus is disclosed for detecting flag velocity during a eutectic process for bonding two wafers. The apparatus includes a plurality of sensors for detecting a time and/or velocity of a plurality of flags within a flag-out mechanism. The apparatus also includes one or more displays displaying time durations associated with the movement of the flags during the bonding process. Also disclosed is a method of aligning wafers in a eutectic bonding process. The method includes determining one or more time durations associated with the movement of the flags in the plurality of flags. The method also includes determining if a misalignment has occurred based on the one or more time durations associated with the movement of the flags.

20 Claims, 7 Drawing Sheets

(56) References Cited

U.S. PATENT DOCUMENTS

| | | | |
|---|---|---|---|
| 2011/0013865 A1* | 1/2011 | Shibata et al. | 385/14 |
| 2012/0021140 A1* | 1/2012 | Dijksman et al. | 427/595 |
| 2012/0186741 A1* | 7/2012 | Lake | 156/306.3 |
| 2014/0319786 A1* | 10/2014 | Johnson et al. | 279/126 |

* cited by examiner

BONDING ALIGNMENT TOOL AND METHOD

BACKGROUND

A number of semiconductor technologies involve aligning two or more wafers and thereafter bonding the wafers. Consider, e.g., the use of eutectic bonding, which applies heat and pressure to connect two or more aligned semiconductor wafers. A sufficient alignment is one in which the features from one wafer are properly aligned to corresponding features on a second wafer. Here, alignment tolerances (the dividing line between sufficient and insufficient alignments) are roughly proportional to the sizes of the features on the wafers. One method of alignment involves the use of two or more "flags," which are markers placed between wafers. After a sufficient alignment is achieved, the flags are removed by a flag-out mechanism, such as a gas-operated mechanism (e.g., using air, $N_2$, etc.) or an electromagnetic mechanism. Removing the flags, however, can result in an insufficient alignment of the wafers, which could cause the entire process to result in unsatisfactory bonding of the wafers.

To minimize unsatisfactory bonding, operators take certain precautions to monitor removal of the flags to ensure that sufficient alignment is maintained. In one approach known to the inventors, an operator visually inspects the alignment to ensure a sufficient alignment is maintained during removing the flags. The operator watches each of the flag-out movements in the mechanism during the removal process and perceptible differences in flag velocity would indicate a misalignment of the wafers. After noticing an insufficient alignment, the operator could respond, e.g., by adjusting the apparatus (e.g., adjusting the gas pressure in a gas-operated mechanism) in order to modify the flag-out procedure based on the perceived differences in flag velocity. However, this method merely makes it possible to achieve a perceptible level of alignment precision. If the differences in each flag's velocity are imperceptible to the operator, not only could a latent, imprecise alignment result, but thereafter bonding the imprecisely aligned wafers would yield an unsatisfactorily bonded set of wafers, which would tend to be scrapped. In other words, an operator's limits of perception can adversely affect a scrap rate (i.e., percentage of unsatisfactorily bonded wafers) of a production and the size of the features on the wafers of a production.

BRIEF DESCRIPTION OF THE DRAWINGS

One or more embodiments are illustrated by way of example, and not by limitation, in the figures of the accompanying drawings, wherein, where ever possible, elements having the same reference numeral designations represent like elements throughout. The accompanying drawings are incorporated herein and are part of this disclosure. The accompanying drawings help explain the principles herein apparent.

DETAILED DESCRIPTION

Figure 1:
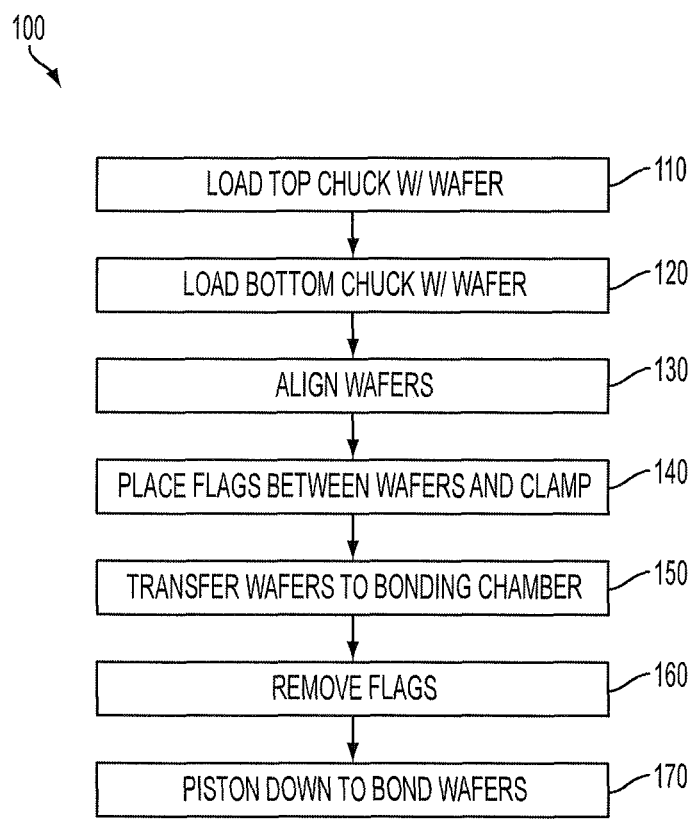
FIG. 1 is a flowchart of a method of aligning two wafers according to some embodiments.

The following disclosure provides many different embodiments, or examples, for implementing different features described below. Specific examples of components and arrangements are described below to simplify the present disclosure. These are, of course, merely examples and are not intended to be limiting. For example, various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Although suitable for different uses, the apparatus and method herein are described with reference to a bonding process. One of ordinary skill would be able to apply the disclosure to technologies involving aligning two or more wafers and optionally thereafter bonding the wafers.

In a bonding process, the process has at least two steps—an alignment phase of aligning two or more wafers to be bonded, and a "piston down" phase of actually heating and pressing the wafers together to complete the bond. FIG. 1 is a flowchart of a method 100 of bonding a wafer in which, according to at least some embodiments, the alignment phase has several steps before execution of the piston down phase for wafer bonding. The bonding process will be described in further detail below, along with a depiction of the process in FIGS. 2A-2E. The alignment and bonding below is described with reference to two wafers for convenience. The alignment can be modified or adapted to apply to more than two wafers. For example, in some embodiments three or four wafers are aligned.

At a step 110, a top plate, or chuck, in an alignment module is loaded with a wafer. Depicted in FIG. 2A, a top plate 210 holds a first wafer 220 with a mechanism such as a vacuum/suction, in order to move wafer 220 into place. At a step 120 and depicted in FIG. 2B, a bottom plate 230 is loaded with a second wafer 240. In some embodiments, the bottom plate 230 holds second wafer 240 in place with a mechanism such as a vacuum/suction mechanism in much the same manner top plate 210 holds wafer 220.

Figure 2A:
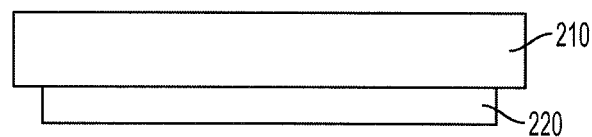
FIGS. 2A-2E show a process of aligning two wafers according to the method of FIG. 1.
Figure 2B:
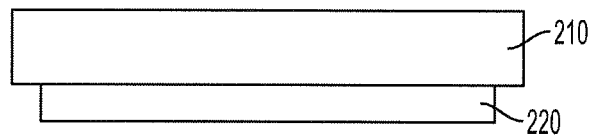
Figure 2B:
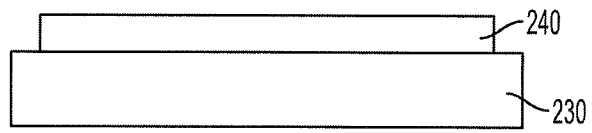
Figure 2C:
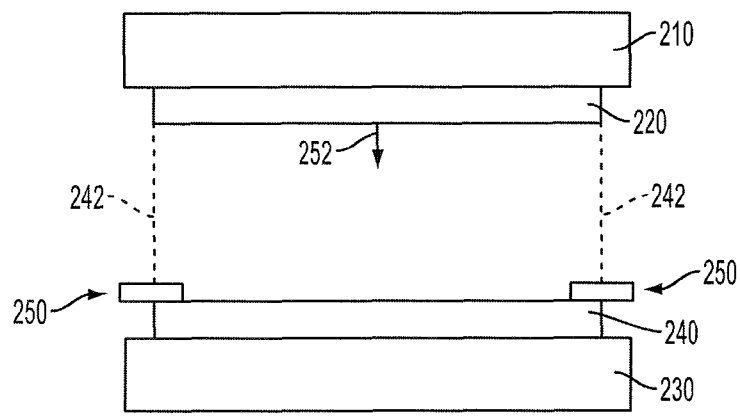
Figure 2D:
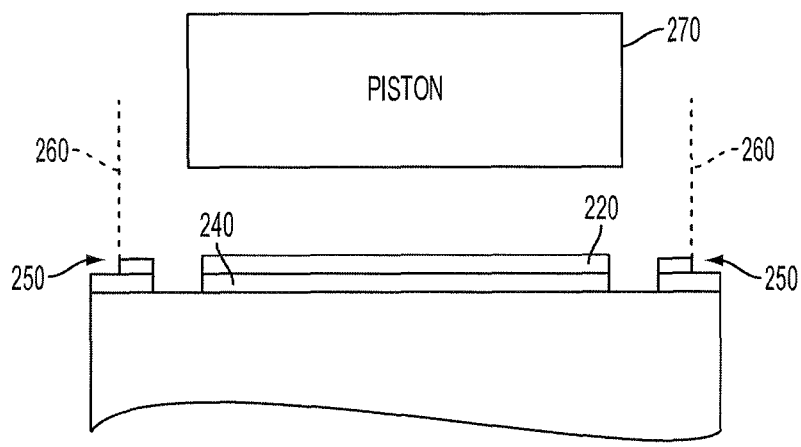
Figure 2E:
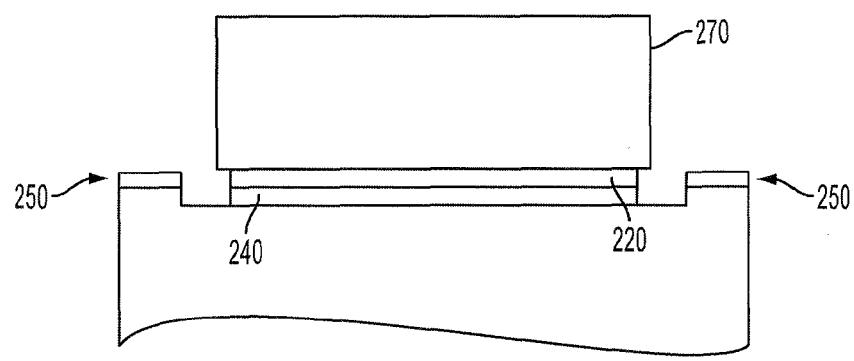

At a step 130 and as shown in FIG. 2C, wafers 220 and 240 are aligned as shown by dashed lines 242. In some embodiments, bonding is achieved by aligning first wafer 220 and second wafer 240 so that a film of pure metal located on wafer 220 contacts a film of an alloy on wafer 240. In alternative embodiments, multiple contact sites are utilized to make multiple bonds, and as a result, aligning multiple contact sites or bonding sites becomes more exacting.

At a step 140, "flags," i.e., markers or spacer elements, are put in place between the wafers and the wafers are clamped holding the flags as depicted in FIG. 2C. During the alignment, a set (e.g., 2, 3, 4, 5, etc.) of flags 250 are used to align wafers that are to be bonded. Then wafer 220 is clamped to wafer 240, shown with a downward arrow 252 in FIG. 2C. Flags 250 are thus clamped between wafers 220 and 240.

In some embodiments of bonding, the alignment is precise, such as for wafers involving micro-electro-mechanical system (MEMS) devices and, as such, the bonded wafers cannot operate properly outside tolerances. In some embodiments, the tolerances are less than 5 µm or 2.5 µm to 10 µm. Thus, the alignment with flags 250 facilitates the degree of precision depending on the specifications of the wafers to be bonded.

At a step 150 (not shown in FIGS. 2A-2E), the wafers are transferred to a bonding chamber. At a step 160, and depicted in FIG. 2D, the flags are then simultaneously removed by a flag-out mechanism and are subsequently placed in a flag-out position 260. In some embodiments, removal is by a gas-operated mechanism. In alternative embodiments, the flag-out step 160 is by an electromagnetic mechanism. At a step 170 and shown in FIG. 2E, a piston 270 presses the wafers together during a piston down process, which bonds wafers 220 and 240.

When flags 250 are removed at the same time and with the same velocity, wafers 220 and 240 remain in alignment and, following the piston down phase in step 170, bonds are formed in the proper places between the two wafers. However, when one or more of flags 250 are removed at different velocities, wafers 220 and 240 are pulled in directions that misalign the wafers. In some embodiments of bonding, this misalignment results in unsatisfactory wafer bonding. Because systems known to the inventors rely on an operator's perception, using some embodiments of the apparatus and method of the present disclosure makes it possible to achieve alignments having tolerances less than 5 μm and not only a greater degree of certainty or precision in flag-out timing but also a lower scrap rate of bonded wafers.

Figure 3:
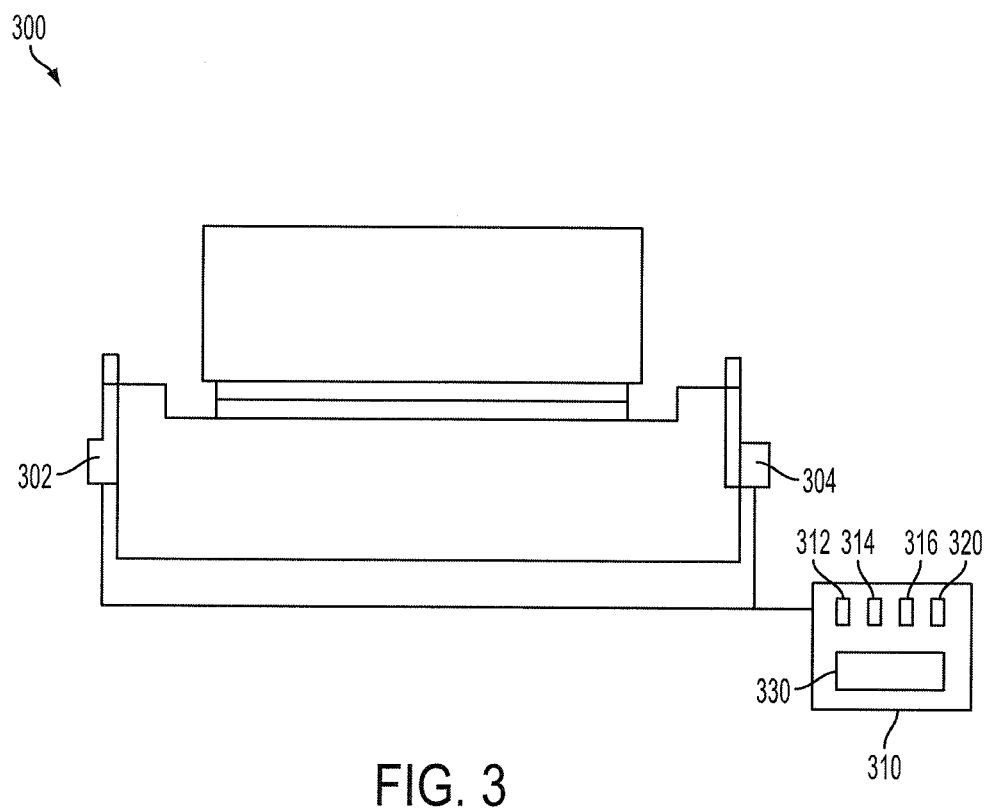
FIG. 3 is a simplified diagram of an apparatus for detecting flag velocity according to some embodiments of the present disclosure.

FIG. 3 is a simplified diagram of an apparatus 300 for detecting flag velocity during a process for bonding two wafers according to some embodiments of the present disclosure. Sensors 302 and 304 are shown and are configured to measure the timing and/or velocity of the flags during the flag-out process. Each sensor 302 and 304 is attached to the bonding apparatus 300 at the point a flag reaches the flag-out position in the flag-out mechanism. Shown in a top-level diagram of FIG. 4, but hidden in FIG. 3, is a third sensor 306, which is attached at the third flag-out mechanism. Sensors 302-306 are photoelectric sensors for detecting when the flag reaches a flag-out position, e.g., positions 260.

While photoelectric sensors are shown, some embodiments use different types of sensors. For example, limit switches, magnetic cylinder switches, electro-mechanical switches, linear variable differential transformer (LVDT) sensors, or other suitable sensors are possible.

Sensors 302-306 are coupled with a control and display module 310, which includes controllers 312, 314, and 316, along with a timer 320, and a display 330. Sensors 302-306 are coupled with controllers 312-316 in order to detect flag velocity and provide feedback for alignment. Controller 312 is an integrated circuit which is configured to receive a first input signal from sensor 302. In conjunction with timer 320, controller 312 calculates the flag-out velocity in order to ensure proper alignment. For instance, controller 312 calculates/determines an elapsed time based on input from timer 320 after the flag-out mechanism is triggered for flag 250 to reach a flag-out position 260 (i.e., trips sensor 302) located a certain distance away from flag 250's starting point. The controller 312 then generates a time value, which is driven to a display 330 and is shown as an elapsed time on the display. Likewise, controllers 314 and 316 receive input signals and calculate the time for the other two flags to reach their respective flag-out positions. Thus, an elapsed time is shown for each flag with precision, e.g., to within 1/100th of a second or better.

While the embodiment shown in FIG. 3 depicts a time measurement, the scope of the present disclosure is not so limited. In other embodiments, controllers 312-316 can calculate a flag-out velocity with use of the distance and time needed for each flag to reach a flag-out position. For example, in some embodiments velocity is calculated and is caused to be displayed on display 330 in millimeters per second. Alternatively, controller 312 receives input signals from sensors 302 and 304, along with timing signals from timer 320. Processing the signals received from each component, controller 312 calculates the differential in time between a first flag and a second flag (i.e., the last flag) reaching the flag-out position. For example, processor 312 can calculate the difference in time between when two of flags 250 reach their respective flag-out positions.

In alternative embodiments, controllers 312 and 314 each calculate a differential time for a three-flag system (i.e., differential between a first and a second flag reaching their respective flag-out positions, and a difference between the second flag and a third flag, the last flag reaching the flag-out position). In still further embodiments, controllers 312-316 calculate three differentials, such that the difference in flag-out velocity between all three flags is displayed. In another alternative embodiment, controller 312 is configured to calculate a time differential on all three sensors (e.g., receive all three inputs and calculate the difference between the time the first input signal is received and the time the third input signal is received). In yet further embodiments, controllers 312-316 are replaced by a single processor, configured to receive any number of input signals necessary, calculate elapsed times and differentials, and perform other calculations with respect to the input signals received from sensors 302-306.

In yet further embodiments, other sensors are used and/or different types of calculations are made. In some embodiments, timer 320 is used in conjunction with a voltage or current reading from alternative sensors 302-306. Therefore, conversion from a voltage or current value to a calculated flag-out time or a flag-out time differential is performed. In still further embodiments, a voltage or a current reading is displayed in much the same manner that a flag-out time reading is displayed, without any differential calculation. Thus, an operator monitors an actual voltage or current reading in order to determine if each flag reaches flag-out without causing misalignment (i.e., within a certain voltage or current threshold). One of ordinary skill in the art will appreciate that a number of other alternative embodiments are possible.

In FIG. 3, controller 312 is a three-pin integrated circuit that receives a positive voltage power signal, a ground signal, and an input signal from sensor 302. Controller 312 combines the input signal received from sensor 302 with timing information from timer 320 to cause display 330 to display a flag-out time. Controllers 314 and 316 are configured similarly with respect to sensors 304 and 306. Thus, all three flag-out velocities are optionally determined and/or displayed.

Figure 5:
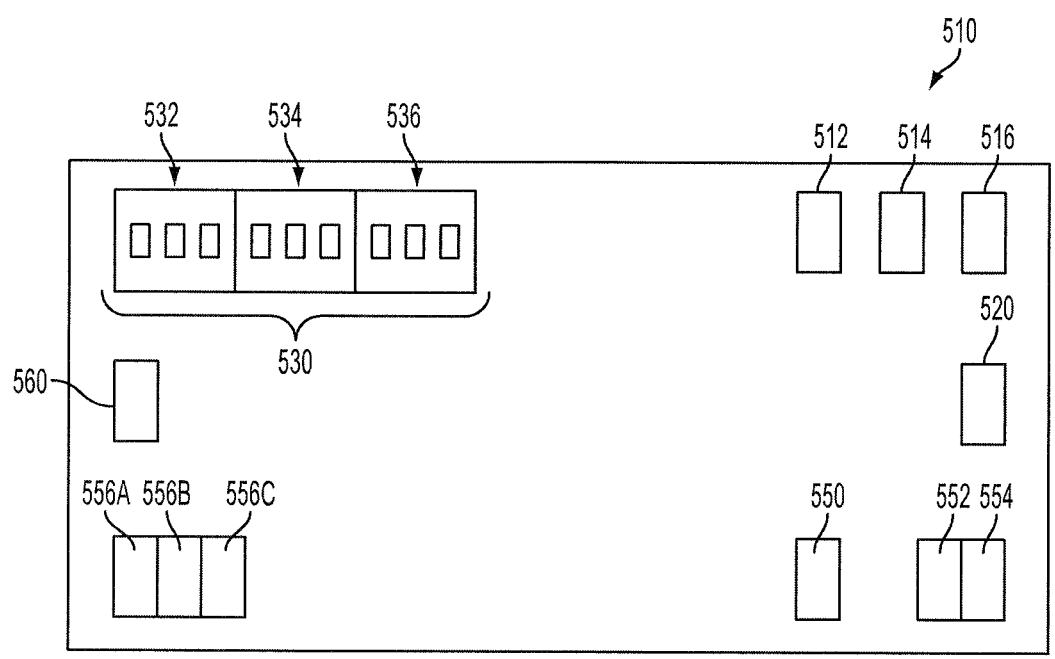
FIG. 5 is a schematic of a display and signal apparatus according to some embodiments.

FIG. 5 is a schematic of a control and display module 510 (formerly 310) according to some embodiments. A number of features of control and display module 510 are not numbered nor described so as not to obscure the present disclosure. Control and display module 510 includes three time displays 532, 534, and 536. As described above with regard to apparatus 300, displays 532-536 display the flag-out time of three flags. Displays 532-536 show the time for each flag to reach a respective flag-out position, e.g., within $1/100^{th}$ of one second or better. In alternative embodiments, a different level of precision may be used. In yet other embodiments, the display is based on a differential time to a specified level of precision. In yet further embodiments, displays 532-536 do not display times at all, but different values, such as velocities, voltages, currents, or other values are displayed.

In other embodiments, values are not displayed at all. Instead, a predetermined threshold is established and displays 532-536 display whether the flag process remains within that threshold. As an example, an upper limit is established at which scrap rate is affected, e.g., an elapsed time of less than 0.05 seconds for a flag to reach the flag out position from when the flag-out mechanism is triggered. Displays 532-536 display an indication as to whether or not the predetermined threshold is maintained. For instance, a green light indicates elapsed times under 0.05 seconds, while a red light indicates times over 0.05 seconds (and perhaps an adjustment by an operator).

Control and display module 510 also includes a tool signal 550, a positive voltage 552, a ground signal 554, three flag voltage signals 556A-556C, and a bypass control 560. Positive voltage 552 and ground signal 554 allow for control and display module 510 to be powered. Tool signal 550 electrically couples control and display module 510 to the eutectic bonding apparatus that is being monitored, such that if the eutectic bonding apparatus is not powered then the control and display module is not operational. Voltage signals 556A-556C ensure that the proper voltage is supplied to the respective flag-out mechanisms. Finally, bypass control 560 allows an operator to operate the bonding apparatus independent of control and display module 510 if necessary for some reason by bypassing module 510 altogether.

Figure 4:
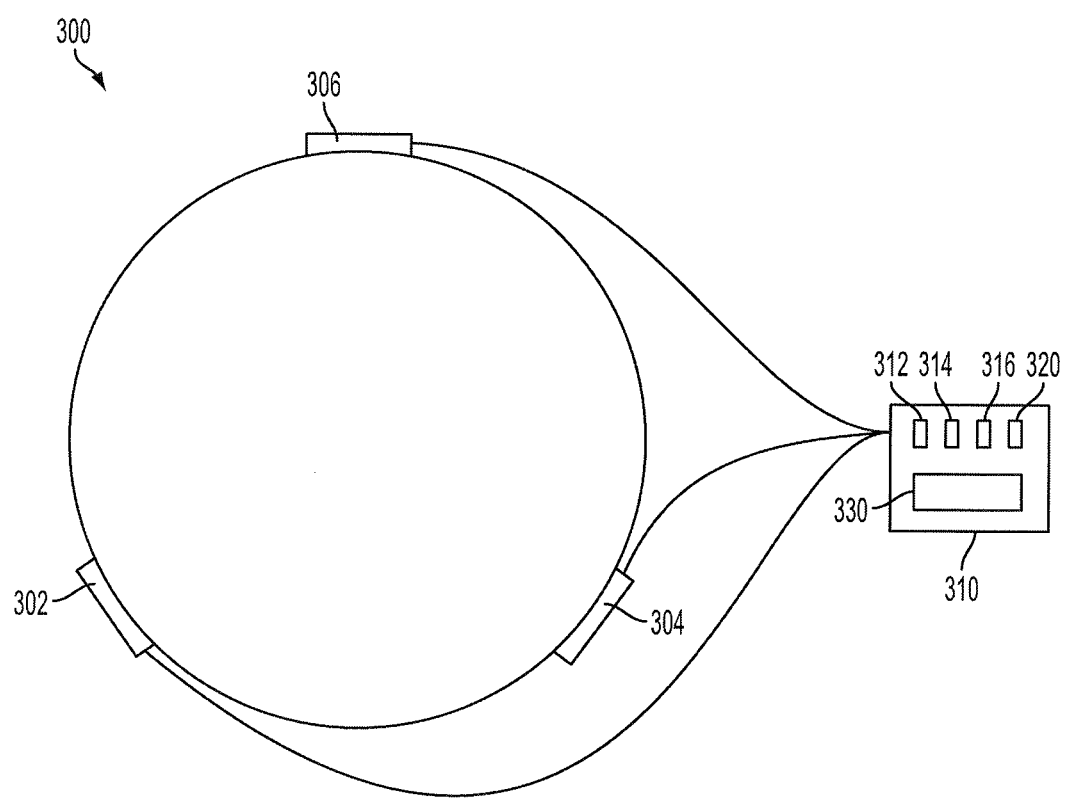
FIG. 4 is a top-view diagram of the FIG. 3 apparatus according to some embodiments.
Figure 6:
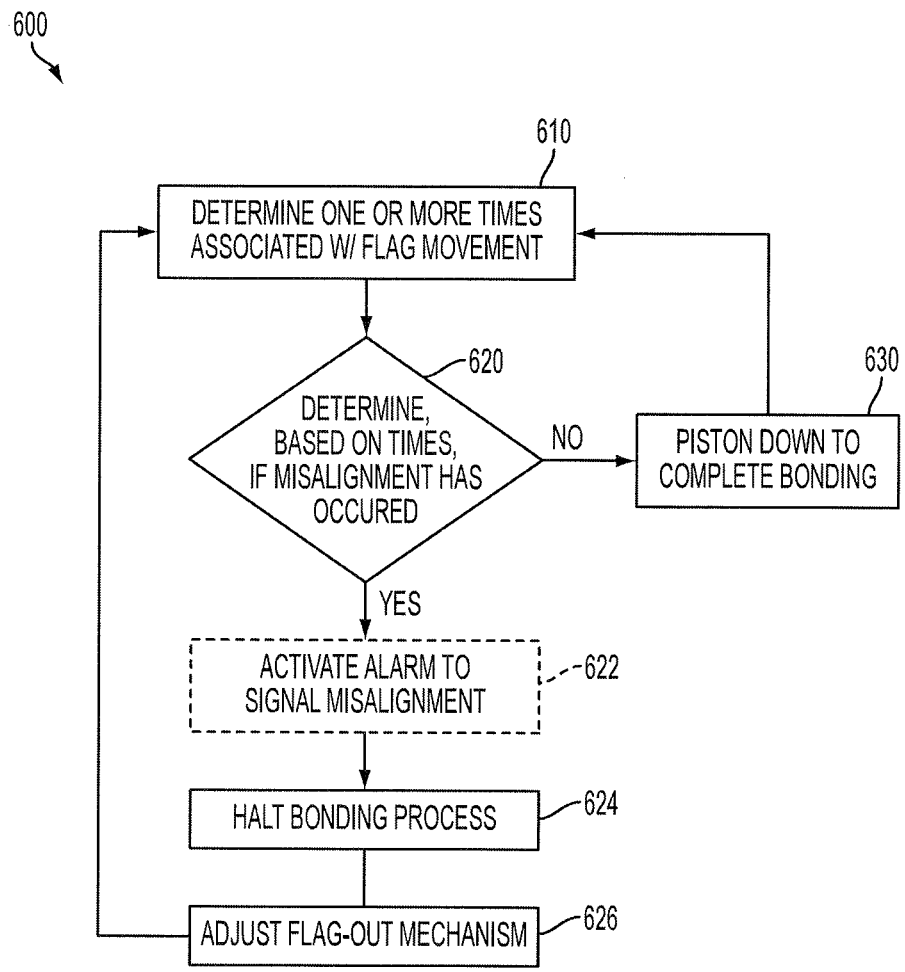
FIG. 6 is a flowchart of a method of aligning wafers in a bonding process according to some embodiments.

FIG. 6 is a flowchart of a method 600 of aligning wafers in a eutectic bonding process according to an embodiment. A plurality of flag-out sensors for detecting movement of a plurality of flags in a flag-out mechanism is provided. For example, three photo-electric flag-out sensors are used in an apparatus as depicted in FIGS. 3-5. In the depicted embodiments, three flags are monitored. In alternative embodiments, more flags or fewer flags are used. In other alternative embodiments, different types of sensors are provided, as described above (e.g., limit switches, magnetic cylinder switches, electro-mechanical switches, linear variable differential transformer (LVDT) sensors, or other suitable sensors).

In some embodiments, a plurality of time displays is also provided. At a step 610, one or more durations of time associated with the movement of the flags in the plurality of flags are determined. As an example, time displays 532-536 as described with regard to FIG. 5 are provided. A display shows the elapsed time for a flag to reach a flag-out position, e.g., as calculated using sensor 302, controller 312, and timer 320 displaying a result on display 532. Displays 534 and 536 also display elapsed times based on sensors 304/306, controller 314/316, and timer 320.

The method continues at a step 620, when a determination as to whether or not misalignment has occurred is made based on the one or more durations of time associated with the movement of the flags. For instance, in the embodiment depicted in FIGS. 3-5, misalignment is determined to have occurred if displays 532-536 indicate a difference in flag-out time greater than a threshold, such as 0.05 seconds. In some embodiments, the threshold varies due to velocity, distance traveled, etc. of the flags being sensed. In other embodiments, a differential timing method is used, and therefore determination is made with regard to a threshold value (e.g., 0.1, 0.05, or 0.01 seconds). In still other embodiments, determination is made by a velocity measurement, a differential velocity measurement, a voltage measurement, a differential voltage measurement, a current measurement, a differential current measurement, or other suitable measurement.

If no misalignment occurs, the piston down process takes place and the wafers are bonded at a step 630. If a misalignment occurs, method 600 can continue with an optional step 622 of activating an alarm. For instance, an alarm can be sounded if the elapsed time difference is greater than 0.05 seconds for any of the flags being monitored or a differential exceeds a predetermined value. In the depicted embodiments, an auditory alarm (e.g., a buzzer or a tone) is sounded. In other embodiments a visual alarm is activated, such as a flashing display light or icon. In yet further embodiments, both visual and audio alarms signal misalignment.

An additional step 624 halts the eutectic bonding process if a misalignment has occurred (or if an alarm is activated in the optional step 622). For instance, if an alarm is sounded at step 622, the bonding process is halted at step 624 until either an adjustment is made in the flag-out mechanism in a step 626, the alarm is cleared, e.g., by an operator, or the bypass control 560 is actuated. If the adjustment is made at step 626, the method 600 returns to step 610 to determine flag-out timing.

An apparatus is disclosed for detecting flag velocity during a process for bonding two wafers. The apparatus comprises a plurality of sensors for detecting flag-out data of a plurality of flags within a flag-out mechanism and at least one controller or processor configured to receive an input from each of the plurality of sensors.

Also disclosed is a method of aligning wafers in a bonding process. The method comprises determining one or more data readings associated with the movement of flags within a plurality of flags in a flag-out mechanism. The method also includes determining if a misalignment of the wafers has occurred based on the one or more data readings associated with the movement of the flags.

An apparatus for detecting flag velocity during a process for bonding two wafers is also disclosed. The apparatus comprises an apparatus for bonding at least two wafers, the apparatus for bonding at least two wafers having a flag-out mechanism for removing a plurality of flags placed between the two wafers for alignment. The apparatus for detecting flag velocity also includes photoelectric sensors for detecting data related to a flag-out condition for the flags within the plurality of flags. The apparatus for detecting flag velocity includes at least one controller or processor configured to receive inputs from the sensors, to calculate at least one value related to flag-out timing, and to drive a display indicating the alignment of the wafers. The apparatus for detecting flag velocity also includes a bypass control for bypassing the sensors and at least one controller or processor.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of aligning two wafers during a bonding process, the method comprising:
   aligning a first wafer having a plurality of alignment markings with a second wafer having a plurality of alignment markings by aligning the plurality of alignment markings of the first wafer with corresponding markings of the plurality of alignment markings of the second wafer;
   placing a plurality of flags between the first wafer and the second wafer;
   clamping the first wafer and the second wafer together;
   detecting movement of the plurality of flags with respect to the first wafer and the second wafer using a plurality of sensors; and determining whether the wafers remain aligned within an alignment tolerance based on the detected movement of the plurality of flags with respect to the first wafer and the second wafer.

2. The method of claim 1, wherein the aligning a first wafer comprises providing a wafer with at least two alignment markings.

3. The method of claim 1, wherein the plurality of sensors comprises at least one of limit switches, magnetic cylinder sensors, photoelectric sensors, electro-mechanical switches, or linear variable differential transformer (LVDT) sensors.

4. The method of claim 1, further comprising removing the plurality of flags from between the wafers by one of a gas-operated mechanism or an electro-magnetic mechanism.

5. The method of claim 1, wherein detecting movement comprises detecting one or more time durations for removing flags.

6. The method of claim 1 further comprising generating a misalignment indicator if the wafers do not remain aligned within the alignment tolerance.

7. The method of claim 6, wherein generating the misalignment indicator comprises at least one of generating an audible or visual alarm.

8. The method of claim 6 further comprising halting a bonding apparatus when a misalignment indicator is generated.

9. The method of claim 6, wherein generating a misalignment indicator occurs if a difference in time between flag removal of a first flag and a second flag is above a predetermined threshold.

10. The method of claim 9, wherein the predetermined threshold is about 0.05 seconds or less.

11. A method of bonding two wafers, the method comprising:
  aligning, within an alignment tolerance, two wafers to be bonded at corresponding bonding sites on each wafer;
  inserting at least two spacer elements between the two wafers;
  pressing the two wafers into contact with the at least two spacer elements;
  holding the two wafers and the at least two spacer elements in substantial alignment;
  withdrawing the at least two spacer elements from the two wafers;
  detecting one or more data readings associated with a movement of each of the at least two spacer elements; and
  bonding the two wafers if the one or more data readings indicate that the two wafers remain aligned within the alignment tolerance after withdrawing the at least two spacer elements.

12. The method of claim 11, further comprising comparing one or more data readings associated with the movement of each of the at least two spacer elements to determine if the two wafers remain aligned within the alignment tolerance after withdrawing the two spacer elements.

13. The method of claim 11, wherein detecting one or more data readings includes measuring at least one of a time duration or a velocity.

14. The method of claim 12, wherein a misalignment indication is generated if a comparison of one or more data readings is outside of a predetermined range.

15. The method of claim 14, wherein detecting one or more data readings comprises determining if respective time durations have a time differential above a predetermined threshold.

16. The method of claim 15, wherein the predetermined threshold is about 0.05 seconds or less.

17. The method of claim 15 further comprising generating an audible or visual alarm responsive to a misalignment indication.

18. The method of claim 11 further comprising halting the bonding process if the one or more data readings indicate that the two wafers did not remain aligned within the alignment tolerance after withdrawal of the at least two spacer elements.

19. A method, comprising:
  holding a first wafer and a second wafer in a manner such that one or more alignment markings of the first wafer are aligned with one or more corresponding alignment markings of the second wafer;
  placing a plurality of spacer elements between the first wafer and the second wafer;
  causing the first wafer and the second wafer to move toward each other;
  removing the plurality of spacer elements;
  detecting, using a plurality of sensors, movements of the plurality of spacer elements during the removal operation of the plurality of spacer elements; and
  determining if a difference of the detected movements of the plurality of spacer elements is less than a predetermined threshold value.

20. The method of claim 19, further comprising:
  bonding the first wafers and the second wafer if the difference of the detected movements of the plurality of spacer elements is less than the predetermined threshold value.

\* \* \* \* \*